United States Patent [19]
Jain et al.

[11] Patent Number: 5,410,265
[45] Date of Patent: Apr. 25, 1995

[54] AMPLIFIER CALIBRATION APPARATUS AND METHOD THEREFOR

[75] Inventors: Praduman Jain, Lowell; Carl Pearson, Boston, both of Mass.

[73] Assignee: Vimak Corporation, Woburn, Mass.

[21] Appl. No.: 129,263

[22] Filed: Sep. 30, 1993

[51] Int. Cl.$^6$ ............................................. H03G 3/10
[52] U.S. Cl. ......................................... 330/2; 381/109
[58] Field of Search ................... 330/2, 129; 381/109, 381/120, 121

[56] References Cited

U.S. PATENT DOCUMENTS 5,194,822  3/1993  Bureau et al. ...................... 330/2 X

OTHER PUBLICATIONS

Data Sheet for DS 1267 Dual Digital Potentiometer Chip by Dallas Semiconductor, Dated: Jan. 1992.

Primary Examiner—Steven Mottola
Attorney, Agent, or Firm—Dick and Harris

[57] ABSTRACT

An amplifier calibration apparatus for use in an audio device which processes an audio signal. The audio device includes a manual volume control for manually altering the gain of the signal. An amplifier which may include a digital potentiometer serves to alter the gain of the audio signal in response to a control signal. The amplifier calibration apparatus, which serves to automatically calibrate the amplifier, includes a controller; a waveform generator, which generates a known waveform, and a comparator circuit. The known waveform is fed into the amplifier and the resulting amplifier output is fed into the comparator circuit. The comparator compares a constant signal to the amplifier output resulting in a comparison output indicative of any difference between the two signals. The comparison signal is operably connected to the controller such that the controller can calibrate the full scale point of the amplifier.

11 Claims, 3 Drawing Sheets

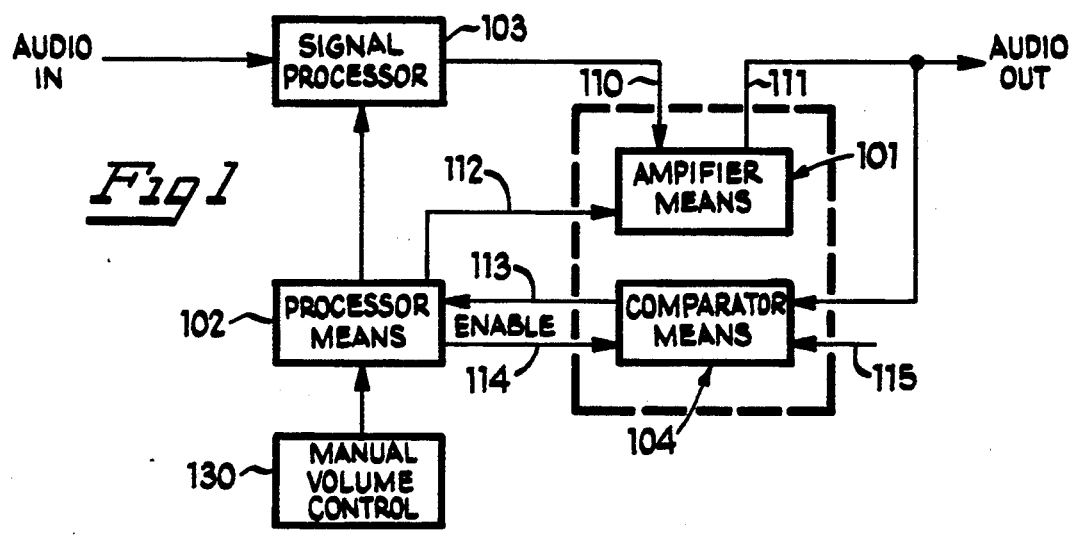
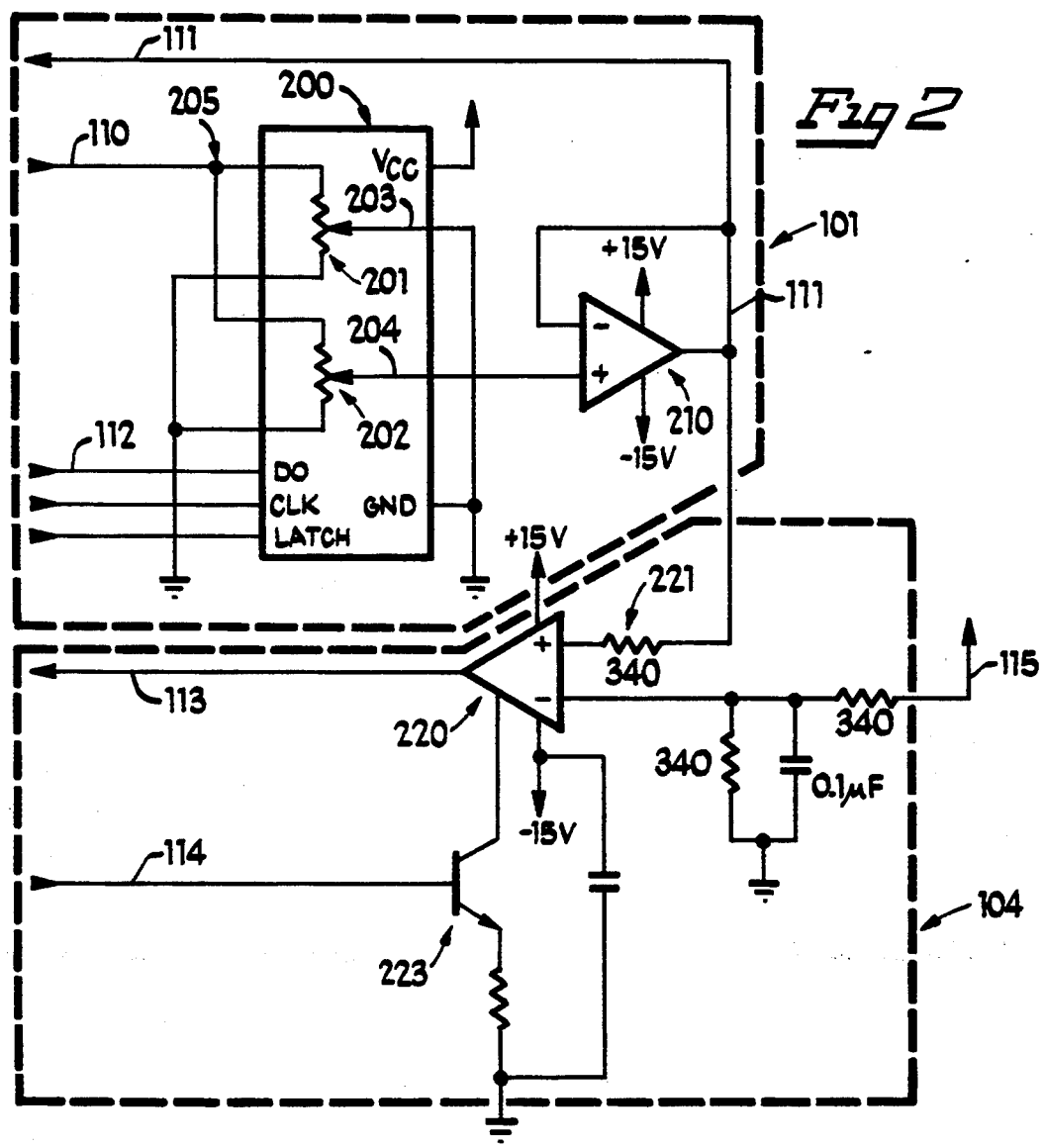

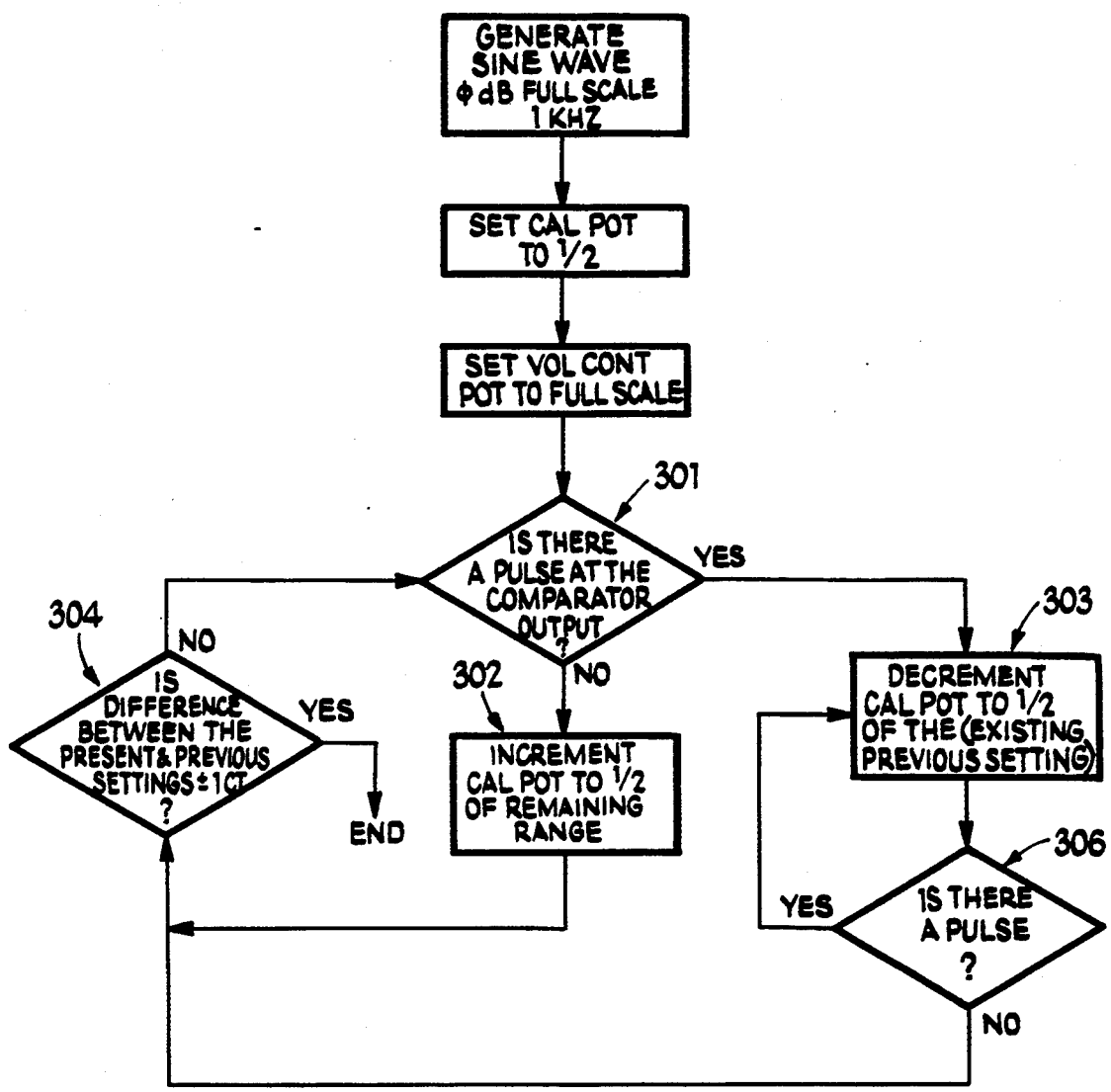

AMPLIFIER CALIBRATION APPARATUS AND METHOD THEREFOR

BACKGROUND OF THE INVENTION

The present invention relates in general to audio amplifiers and, in particular, to an amplifier calibration apparatus and method for calibrating the gain of an amplifier automatically, such that upon manual control of the gain thereof the usable range is consistent from power-up to power-up and is independent of component aging.

There are numerous methods for amplifying audio signals. The most prevalent of which is the use of operational amplifiers. Operational amplifiers provide good linearity in their respective range and good noise and impedance characteristics, all of which is particularly useful in high-end audio components.

Another approach to amplifying audio signals involves the use of a potentiometer in conjunction with an operational amplifier to alter the resistance of the audio path so as to control the gain over that path. Although potentiometers are significantly less expensive than operational amplifiers, they are rarely used in the critical path of high performance audio equipment. Potentiometers suffer from unacceptably large variations in resistance, which prevent the balancing of two channels in a stereo system and further prevents the maintenance of a range through which a user can consistently control volume.

It is thus an object of the present invention to provide an automatic amplifier calibration apparatus which allows the use of potentiometers, while substantially negating variations in resistance, thus providing calibration for each individual channel and desirable balance between those channels.

It is a further object of the present invention to provide an amplifier calibration apparatus which may be added into an existing audio system designed to accept such an apparatus as an add-on board.

These and other objects of the present invention will become apparent in light of the present specification, claims and drawings.

SUMMARY OF THE INVENTION

The present invention comprises an amplifier calibration apparatus for use in an audio device which processes an audio signal. The audio device includes a manual volume control for manually altering the gain of the audio signal. The amplifier calibration apparatus is comprised of amplifier means, control means, generator means and comparator means. The amplifier calibration apparatus includes amplifier means having a control, an input and a corresponding output. The amplifier means serves to alter the gain of the audio signal in response to a control signal. The amplifier calibration apparatus serves to automatically calibrate the amplifier means.

The control means controls the audio device (including the amplifier means) and further serves to control calibration of the amplifier means. In the preferred embodiment, the controller means comprises a microprocessor, such as the Motorola 80C552.

The generator means generates a known waveform in response to a command from the control means. This known waveform, which may comprise a sinusoidal waveform, is operably fed into the input of the amplifier means. In a preferred embodiment, the generating means comprises a digital signal processor which further processes the audio signal in the digital domain. The comparator means compares a constant signal, such as a precision 10 V DC, to the corresponding output of the amplifier means, which is an "amplified" version of the known waveform. Comparing means provides a comparison output which is indicative of any difference between the constant signal and the corresponding output. This comparison output is operably connected to the control means such that the control means can calibrate the amplifier means by setting a set point. In a preferred embodiment, the comparing means includes an operational amplifier.

In a preferred embodiment, the amplifying means and the comparing means are disposed on a single plug-in card which is operably insertable into the audio device to provide gain control and calibration.

In one embodiment, the amplifier means comprises a digital potentiometer having a digital control, an input and a corresponding output. The digital control has values within an operating range indicative of the gain of the amplifier means.

In operation, a signal generator located within the audio device and under the direction of the processor means generates a test signal. The test signal, a known waveform, is then scaled by the digital potentiometer to obtain a scaled test signal which is compared to a constant signal in a comparator circuit located within the audio device. Any difference between the scaled test signal and the constant is indicated to the processor means, which alters the value of a digital control word operably fed into the digital control of the digital potentiometer. These steps are repeated until the difference between the current and previous value of the digital control is one LSB (least significant bit).

Altering the value of the digital control word is accomplished by incrementing the value of the digital control word by half the difference between the value of the digital control word and the bottom of the operating range when the scaled test signal is less than the constant signal or by decrementing the value of the digital control word by half of the difference between the current value of the digital control word and its previous value when the scaled test signal is greater than the constant signal. The value of the digital control word is then saved as a previous value for future calculations.

BRIEF DESCRIPTION OF THE DRAWINGS

FIG. 1 of the drawings is a block diagram of the present amplifier calibration apparatus;

FIG. 2 of the drawings is a schematic block diagram of the amplifier means and comparator means of the present amplifier calibration apparatus;

FIG. 3 of the drawings is a flow chart of the process for altering the set point of the amplifier means.

DETAILED DESCRIPTION OF THE DRAWINGS

Figure 4:
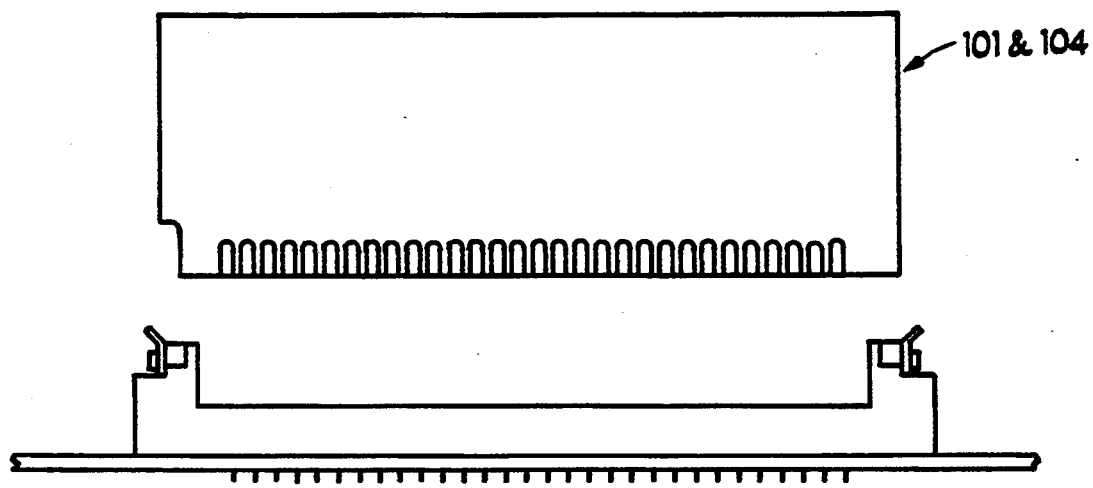
FIG. 4 of the drawings is a front elevational view of the plug-in card embodiment of the present amplifier calibration apparatus.

While this invention is susceptible of embodiment in many different forms, one specific embodiment is shown in the drawings and will herein be described in detail, with the understanding that the present disclosure is to be considered a an exemplification of the principles of the present invention and is not intended to limit the invention to the embodiment illustrated.

FIG. 1 of the drawings is a block diagram of Applicants' amplifier calibration apparatus 100, which includes amplifying means 101, processor means 102, waveform generating means 103 and comparator means 104. As shown in FIG. 1, amplifier calibration apparatus 100 may be utilized within a stereo audio device having two channels. However, inasmuch as both channels are identical in amplifier calibration apparatus 100, only one channel will be described herein with the understanding that the principles and elements of the illustrated channel are identical in the channel which has not been depicted.

Amplifier means 101 has input 110, corresponding output 111 and control 112, which serves to alter the gain of the audio signal between input 110 and corresponding output 111. A preferred embodiment of amplifying means 101 is shown in FIG. 2 of the drawings. In this preferred embodiment, amplifying means 101 comprises dual potentiometer 200 and operational amplifier 210. Dual potentiometer 200, which in this embodiment comprises a DS1267 from Dallas Semiconductor, includes calibration potentiometer 201 and gain potentiometer 202. The top terminal of both calibration potentiometer 201 and gain potentiometer 202 are connected to input 110, which is operably connected to the output of signal processor means (waveform generating means) 103. The bottom terminals of both calibration potentiometer 201 and gain potentiometer 202 are connected to ground. Wiper 203, the output of calibration potentiometer 201 is also grounded, such that calibration potentiometer 201 functions solely as a variable resistance element tied between node 205 and electrical ground.

Calibrating potentiometer 201 and gain potentiometer 202 are adjusted by digital control word 112 generated by processor means 102. In an embodiment utilizing the Dallas Semiconductor DS1267, each potentiometer has 256 potential resistance values. These values are selected by digital control word 112, which is serially downloaded from processor means 102 in the following manner: the first bit a constant 1; the next 8 bits the value for calibration potentiometer 201 and the final 8 bits the value for gain potentiometer 202.

During calibration, node voltage 205, which is the maximum voltage attainable at wiper 204 (the output of gain potentiometer 202), is varied by varying at least the portion of digital control word 112 which controls calibration potentiometer 202. For instance, by reducing the resistance of calibration potentiometer 201, node voltage 205 is reduced, thus causing wiper 204 and thus corresponding output 111 to vary from its maximum toward its minimum. This process, which is more fully described with respect to FIG. 3, results in resetting the set point, which corresponds to a full scale gain in amplifier means 101 between input 110 and corresponding output 111 for the current resistive tolerances exhibited by dual potentiometer 200.

Simultaneously, the dual potentiometer in the sister channel is undergoing a similar, but independent process, such that if the resistive tolerances of the right channel and left channel dual potentiometers have varied in different manners, such imbalance between the channels is incidentally balanced by resetting each to the same full scale set point. Thus, each channel could have their respective calibration potentiometer controlled by different digital control words, which, in turn, will result in tracking between the channels from this common base point.

The output of gain potentiometer 202, wiper 204, is connected to the positive terminal of operational amplifier 210. Operational amplifier 210 is configured in a non-inverting unity buffer amplifier configuration—the output of operational amplifier 210 is fed back into its negative terminal of operational amplifier 210. This unity gain buffer provides a constant low output impedance which is independent of the setting of gain potentiometer 202. In a preferred embodiment, operational amplifier 210 is comprised of a low noise operational amplifier, which serves to further improve the calibration of amplifier means 101.

In a preferred embodiment, comparator means 104 comprises comparator 220; resistor 221; resistive network 222; and switch 23. Comparator 220 is configured in a difference configuration, whereby constant signal 115 is subtracted from corresponding output 111 from amplifier means 101 resulting in comparison output 113. Switch 223, which is controlled by enable 114—generated by controller means 102—disables comparator 220 such that it cannot effect the operation of the audio device after calibration has been completed. Upon power-up, processor means 102 sends enable 114 to switch 223 which, in turn, provides comparator 220 with its required negative operating voltage such that it can operate normally. In a preferred embodiment, constant signal 115 comprises a precision 10 V DC reference voltage, however, constant signal 115 may take any known DC value, as long as this value is reflected in the calculations performed by processor means 102.

The output of comparator 220 is comparison output 113. Where the known waveform is a sinusoidal wave having peaks greater than constant signal 115, comparison output 113 will comprise a square wave having a duty cycle which indicates the difference between corresponding output 111 and constant signal 115. Comparison output 113 is returned to processor means 102 such that processor means 102 may determine the set point and alter the value of digital control word 112, as necessary.

Processor means 102 controls the entire audio device including amplifier means 101 and signal processor 103, as well as additional circuitry not shown. Processor means 102, which in a preferred embodiment may comprise a Motorola 80C552 microprocessor, includes means for setting the set point for amplifying means 101, which corresponds to a full scale gain between input 110 and corresponding output 111.

Signal processing means 103 comprises a digital signal processor in a preferred embodiment, which processes any signal in the digital domain as well as being capable of generating various waveforms. During calibration, signal processing means 103, acting as waveform generating means 103 generates a known waveform on input 110. In a preferred embodiment, this known waveform comprises a 1 kHz sine wave at 0 dB, full scale. Incidentally, signal processing means 103 operably prevents any "true" audio signal from entering amplifier means 101 during calibration, inasmuch as its outputs are being utilized to output the known waveform. However, once calibration is complete, signal processing means 103 functions in its "normal" manner by passing audio signals onto calibrated amplifier means 101.

In a preferred embodiment, amplifier means 101 and comparator means 104 are operably disposed upon a single plug-in card. As show in FIG. 4, this plug-in card is operably insertable into an audio device through various connection means such as jumpers, SIMM sockets, and other means of inserting a removable plug-in card, as known to those with ordinary skill in the art.

In operation, amplifier means 101 is controlled by utilizing digital control word 112, which has a value within a set operating range. First, processor means 102 directs signal processor 103 to generate a test signal, which may comprise 1 kHz sinusoidal wave at 0 dB full scale. This known waveform is directed into amplifier means 101 on input 110 where it is amplified resulting in an scaled test signal on corresponding output 111. During calibration, enable signal 114 enables comparator means 104, which compares corresponding output 111 to constant signal 115. Any difference between these two signals is indicated by comparison output 113 which is fed back to processor means 102. Processor means 102 includes setting means which sets a set point (corresponding to zero gain in gain potentiometer 202) for amplifying means 101.

FIG. 3 of the drawings is a flow chart illustrating the setting means which is carried out by processor means 102 in a preferred embodiment. In this embodiment, as described above, where corresponding output 111 is greater than constant signal 15, comparison output 113 will comprise a square wave or "pulses," 301. Thus, where corresponding output 111 (the scaled test signal) is less than constant signal 115 pulses are not present and processor means 102 increments the value of digital control word 112 by one-half the difference between the value of digital control word 112 and a constant zero point, 302. Conversely, where comparison output 113 indicates that corresponding output 111 is greater than constant signal 115, pulses are present and processor means 102 decrements the value of digital control word 112 by one-half the difference between the current value of digital control word 112 and the previous value of digital control word 112, 303. The previous value of digital control word 112 is saved in memory before any adjustments thereto, such as within processor means 102.

From step 302, the process continues to determine if the difference between present digital control word 112 and previous digital control word is plus/minus one (1)—if so the set point has been found and the amplifier calibration apparatus deactivates (i.e. comparator 220 in comparator means 104 is disabled), 304. If the difference between present digital control word 112 and previous digital control word is too great, the process returns to step 301.

From step 303 there is a separate step for determining whether corresponding output 111 is greater than constant signal 115, 306. If corresponding output 111 is greater, a pulse will appear in comparison output 113 resulting in a return to step 303. If constant signal 115 is greater than the process continues to step 304. It is contemplated that less than eight iterations will be necessary to complete the calibration, which will occur in such abbreviated time as to be substantially imperceptible to the user.

The foregoing description and drawings merely explain and illustrate the invention and the invention is not limited thereto except insofar as the appended claims are so limited, as those skilled in the art who have the disclosure before them will be able to make modifications and variations therein without departing from the scope of the invention.

What is claimed is:

1. An amplifier calibration apparatus comprising:
   means for amplifying a signal, said amplifying means having a control, an input and a corresponding output, said control serving to set the gain of said signal between said input and said corresponding output, said amplifying means including a first variable resistor, the value of said first variable resistor determining said gain of said signal;
   means for setting a set point for said amplifying means, said set point corresponding to a zero gain between said input and said corresponding output, said set point being operably asserted upon said control of said amplifying means and varying between each power up of said amplifying means, said setting means comprising:
   means for generating a known waveform, said known waveform being operably asserted upon said input of said amplifying means;
   a second variable resistor, said second variable resistor serving to set a maximum voltage drop across said first variable resistor in response to the value of said set point to, in turn, limit the full scale gain of said amplifying means;
   means for comparing a constant signal to said corresponding output of said amplifying means during operable assertion of said known waveform; and
   means for changing said set point in response to said comparing means.

2. The invention according to claim 1 wherein said amplifying means and said comparing means are operably disposed up on a single plug-in card, said plug-in card being operably insertable into a pre-existing audio device to provide gain control and calibration.

3. An amplifier calibration apparatus for use in an audio device which processes an audio signal, said audio device including an amplifier having at least one audio input, each of said at least one audio inputs having a corresponding audio output, said amplifier serving to alter the gain of said audio signal in response to a control signal, said audio device further including a manual volume control for manually altering said gain of said audio signal, said amplifier calibration apparatus, which serves to automatically calibrate said amplifier comprises:
   means for controlling said audio device, including said amplifier, said control means further serving to control calibration of said amplifier;
   means for generating a known waveform, said generating means generating said known waveform in response to a command from said control means, said known waveform being operably fed into one of said at least one audio inputs of said amplifier;
   means for comparing a constant signal to said corresponding audio output corresponding to said one of said at least one audio inputs, said comparing means having a comparison output indicative of any difference between said constant signal and said corresponding output, said comparison output operably connected to said control means such that said control means can calibrate said amplifier.

4. The invention according to claim 3 wherein said generating means comprises a digital signal processor for processing said audio signal in the digital domain, said digital signal processor further serving in response to said processor means, to generate said known waveform.

5. The invention according to claim 3 wherein said known waveform comprises a sinusoidal waveform.

6. The invention according to claim 3 wherein said comparing means includes an operational amplifier.

7. An amplifier calibration apparatus for use in an audio device which processes an audio signal for output as a processed audio signal, said audio device including an amplifier having at least one audio input, each of said at least one audio input having a corresponding audio output, said amplifier serving to alter the gain of said audio signal in response to a control signal, said audio device further including a manual volume control for manually altering said gain of said audio signal, said audio device also including a controller which serves to control the audio device, a generator for generating a known waveform in response to a command from said controller, said known waveform being operably fed into one of said at least one audio inputs of said amplifier, the improvement comprising:
- means for comparing said known signal to said corresponding audio output of said amplifier when said known waveform is applied thereto, resulting in a comparison signal which is operably fed into said controller to alter the zero point of said amplifier; and
- a plug-in card containing said amplifier and said comparing means to provide upgradeability for said audio device, said audio device being fully operable in the absence of said plug-in card.

8. A method for automatically calibrating an amplifier contained in an audio device, the amplifier comprising a digital potentiometer having a digital control, an input and a corresponding output, the digital control having value within an operating range indicative of the gain of the amplifier, the method comprising the steps of:
a) generating a test signal using a signal generator located within the audio device as directed by a processor device located within the audio device;
b) scaling the test signal in the digital potentiometer to obtain an scaled test signal;
c) comparing the scaled test signal to a constant signal in a comparator circuit located within the audio device;
d) indicating any difference between the scaled test signal and the constant signal to the processor device;
e) altering the value of a digital control word operably fed into the digital control potentiometer in response to an indicated difference; and
f) repeating steps (a) through (e) until the difference between the current value of the digital control word and the previous value of the digital control word equals one.

9. The method according to claim 8 wherein the step of altering the value of the digital control word comprises the substeps of:
incrementing the value of the digital control word by half the difference between the value of the digital control word and the bottom of the operating range upon the scaled test signal being greater than the constant signal;
decrementing the value of the digital control word by half of the difference between the value and the previous value upon the scaled test signal being smaller than the constant signal; and
saving the value as a previous value in the processor device.

10. An amplifier calibration apparatus comprising:
means for amplifying a signal, said amplifying means having a control, an input and a corresponding output, said control serving to set the gain of said signal between said input and said corresponding output;
means for setting a set point for said amplifying means, said set point corresponding to a zero gain between said input and said corresponding output, said set point being operably asserted upon said control of said amplifying means and varying between each power up of said amplifying means, said setting means comprising:
means for generating a known waveform, said known waveform being operably asserted upon said input of said amplifying means;
means for comparing a constant signal to said corresponding output of said amplifying means during operable assertion of said known waveform; and
means for changing said set point in response to said comparing means, said set point changing means including:
means for incrementing said set point by one-half the difference between the current value of said set point and zero when no signal is received from said comparing means;
means for decrementing by one-half the difference between the current value of said set point and the previous said set point when a signal is received from said comparing means; and
means for storing said current set point as said previous set point.

11. An amplifier calibration apparatus comprising:
means for amplifying a signal, said amplifying means having a control, an input and a corresponding output, said control serving to set the gain of said signal between said input and said corresponding output, said amplifying means comprising:
a first variable resistor, the value of said first variable resistor serving to vary said gain of said signal;
means for providing a low impedance output, said low impedance output means operably accepting output from said first variable resistor for transmission as said corresponding output;
means for setting a set point for said amplifying means, said set point corresponding to a zero gain between said input and said corresponding output, said set point being operably asserted upon said control of said amplifying means and varying between each power up of said amplifying means, said setting means comprising:
means for generating a known waveform, said known waveform being operably asserted upon said input of said amplifying means;
a second variable resistor serving to set a maximum voltage drop across said first variable resistor in response to the value of said set point to, in turn, limit the full scale gain of said amplifying means;
means for comparing a constant signal to said corresponding output of said amplifying means during operable assertion of said known waveform, and
means for changing said set point in response to said comparing means.

* * * * *